(12) United States Patent
Chang et al.

(10) Patent No.: US 12,740,053 B2
(45) Date of Patent: Sep. 15, 2026

(54) SEMICONDUCTOR DEVICE INCLUDING DIFFERENT CONDUCTIVE LINES

(71) Applicant: SAMSUNG ELECTRONICS CO., LTD., Suwon-si (KR)

(72) Inventors: Jihoon Chang, Suwon-si (KR); Jaejoon Song, Suwon-si (KR); Heonjun Ha, Suwon-si (KR); Jongmoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 18/243,731

(22) Filed: Sep. 8, 2023

(65) Prior Publication Data

US 2024/0090202 A1 Mar. 14, 2024

(30) Foreign Application Priority Data

Sep. 8, 2022 (KR) ........................ 10-2022-0114379

(51) Int. Cl.
*H10B 12/00* (2023.01)
*H10W 20/41* (2026.01)

(52) U.S. Cl.
CPC ........... *H10B 12/482* (2023.02); *H10B 12/02* (2023.02); *H10B 12/315* (2023.02); *H10B 12/50* (2023.02); *H10W 20/423* (2026.01)

(58) Field of Classification Search
CPC .... H10B 12/482; H10B 12/02; H10B 12/315; H10B 12/50; H10B 12/05; H10B 12/48; H10B 12/30; H01L 23/5225; G11C 11/4097
See application file for complete search history.

(56) References Cited

U.S. PATENT DOCUMENTS

| | | | | |
|---|---|---|---|---|
| 8,248,876 | B2 | 8/2012 | Masuoka et al. | |
| 9,245,976 | B2 | 1/2016 | Cho et al. | |
| 11,145,656 | B2 | 10/2021 | Ramaswamy | |
| 2011/0303974 | A1 | 12/2011 | Kim et al. | |
| 2012/0199842 | A1 | 8/2012 | Takemura | |
| 2013/0087842 | A1 | 4/2013 | Kim et al. | |
| 2021/0098464 | A1* | 4/2021 | Huang | H01L 21/7682 |
| 2021/0134355 | A1* | 5/2021 | Lee | G11C 11/4094 |
| 2022/0102352 | A1 | 3/2022 | Lee et al. | |
| 2024/0274203 | A1* | 8/2024 | Song | G11C 16/26 |

FOREIGN PATENT DOCUMENTS

| | | |
|---|---|---|
| KR | 10-2000-0067767 A | 11/2000 |
| KR | 10-2022-0043981 A | 4/2022 |

* cited by examiner

*Primary Examiner* — Mohammad A Rahman
(74) *Attorney, Agent, or Firm* — Muir Patent Law, PLLC

(57) ABSTRACT

A semiconductor device includes a lower structure, an interlayer insulating layer on the lower structure, a conductive shielding line on the lower structure and penetrating through the interlayer insulating layer, a capping insulating layer on the interlayer insulating layer and the conductive shielding line, and a bit line on the lower structure and penetrating through the capping insulating layer and the interlayer insulating layer. An upper surface of the bit line is at a higher level than an upper surface of the conductive shielding line. A lower surface of the bit line is at a level equal to or lower than a level of a lower surface of the conductive shielding line.

18 Claims, 16 Drawing Sheets

SEMICONDUCTOR DEVICE INCLUDING DIFFERENT CONDUCTIVE LINES

CROSS-REFERENCE TO RELATED APPLICATION(S)

This application claims benefit of priority to Korean Patent Application No. 10-2022-0114379 filed on Sep. 8, 2022 in the Korean Intellectual Property Office, the disclosure of which is incorporated herein by reference in its entirety.

BACKGROUND

1. Field

Example embodiments relate to a semiconductor device including different conductive lines and a method of manufacturing the same.

2. Description of the Related Art

Research has been conducted to reduce the size of elements included in a semiconductor device and to improve the performance thereof. With a reduction in the size of the elements included in the semiconductor device, RC delay, which is caused by parasitic capacitance between bit lines, has emerged as a big issue with respect to bit lines that have a reduced size.

SUMMARY

Embodiments are directed to a semiconductor device including a lower structure an interlayer insulating layer on the lower structure, a conductive shielding line on the lower structure, the conductive shielding line penetrating through the interlayer insulating layer, a capping insulating layer on the interlayer insulating layer and the conductive shielding line, and a bit line on the lower structure, the bit line penetrating through the capping insulating layer and the interlayer insulating layer, wherein an upper surface of the bit line is at a higher level than an upper surface of the conductive shielding line, and a lower surface of the bit line is at a level equal to or lower than a level of a lower surface of the conductive shielding line.

Embodiments further include a semiconductor device including a lower structure, a first conductive line on the lower structure; and a second conductive line on the lower structure and spaced apart from the first conductive line, wherein an upper surface of the second conductive line is at a higher level than an upper surface of the first conductive line, a lower surface of the second conductive line is at a level the same as or lower than a level of a lower surface of the first conductive line, and a slope of a side surface of the second conductive line is different from a slope of a side surface of the first conductive line.

Embodiments further include a semiconductor device including a substrate, a circuit device on the substrate, a wiring structure on the substrate and electrically connected to the circuit device, bit lines respectively extending in a first horizontal direction, and at a level higher than level of the wiring structure, conductive shielding lines arranged alternately with the bit lines in a second horizontal direction perpendicular to the first horizontal direction, and word lines respectively extending in the second horizontal direction, wherein the word lines are at a higher level than the bit lines and the conductive shielding lines upper surfaces of the bit lines are at a higher level than upper surfaces of the conductive shielding lines, and each of the bit lines has a negative slope.

BRIEF DESCRIPTION OF DRAWINGS

Features will become apparent to those of skill in the art by describing in detail exemplary embodiments with reference to the attached drawings in which.

DETAILED DESCRIPTION

Figure 1:
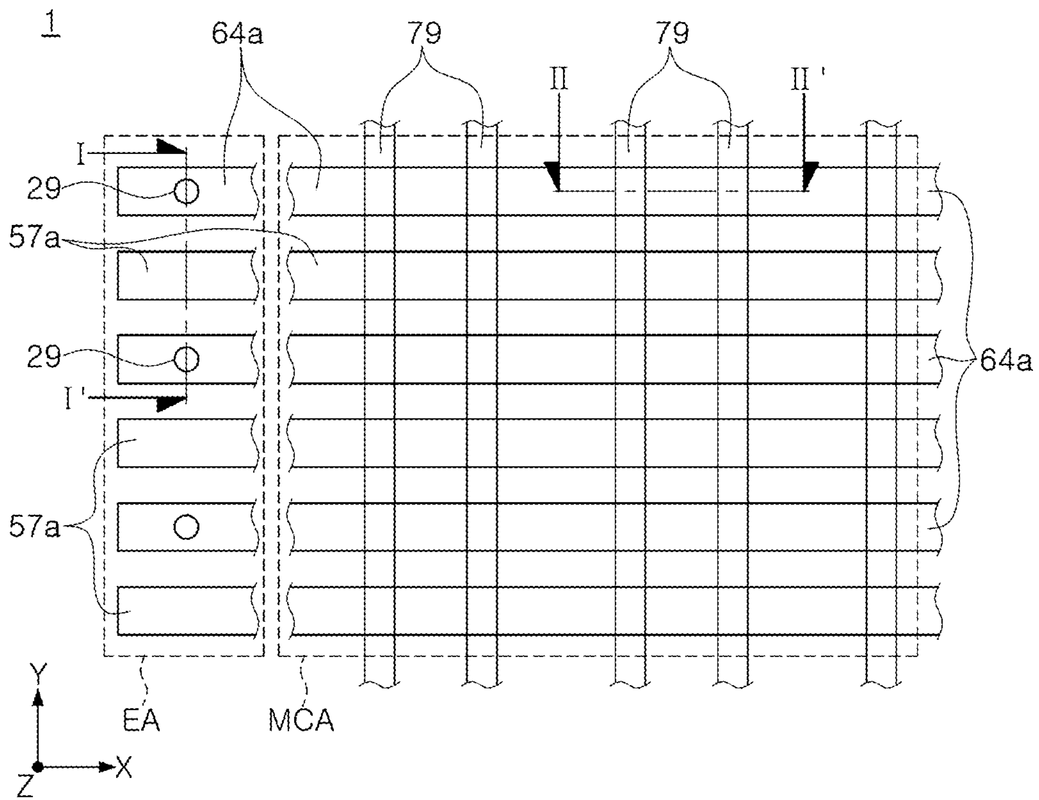
FIGS. 1, 2A and 2B are schematic views illustrating an example of a semiconductor device according to an example embodiment.
Figure 2A:
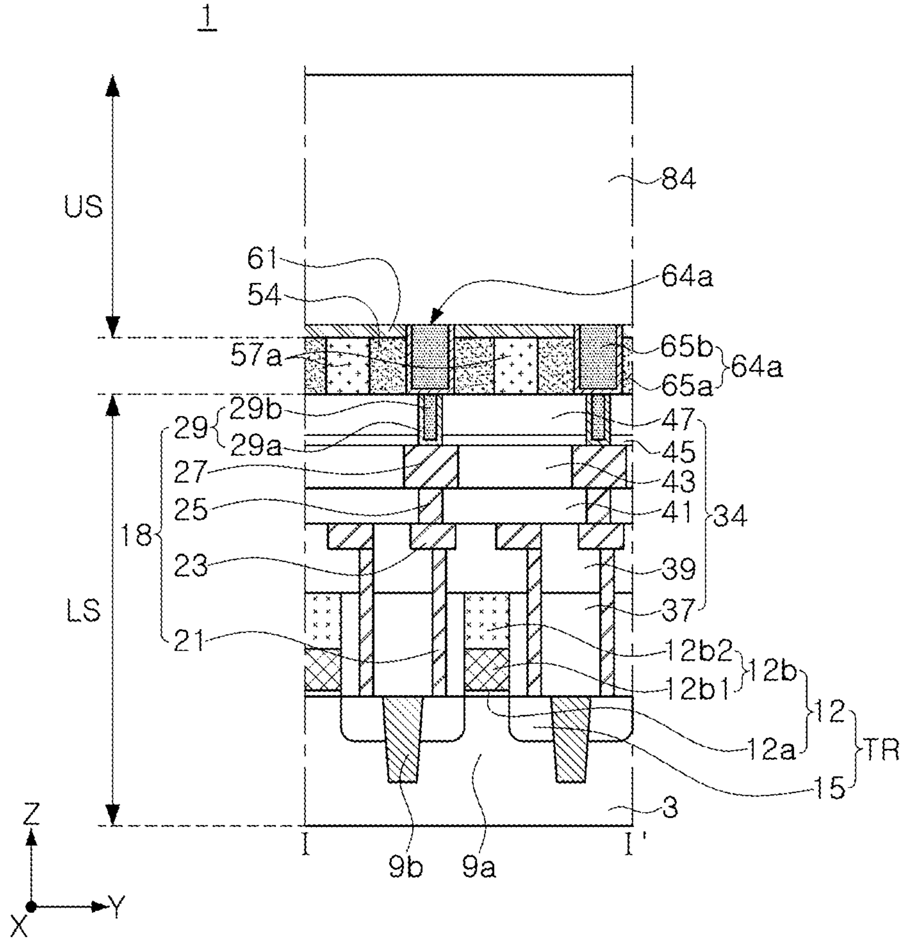
Figure 2B:
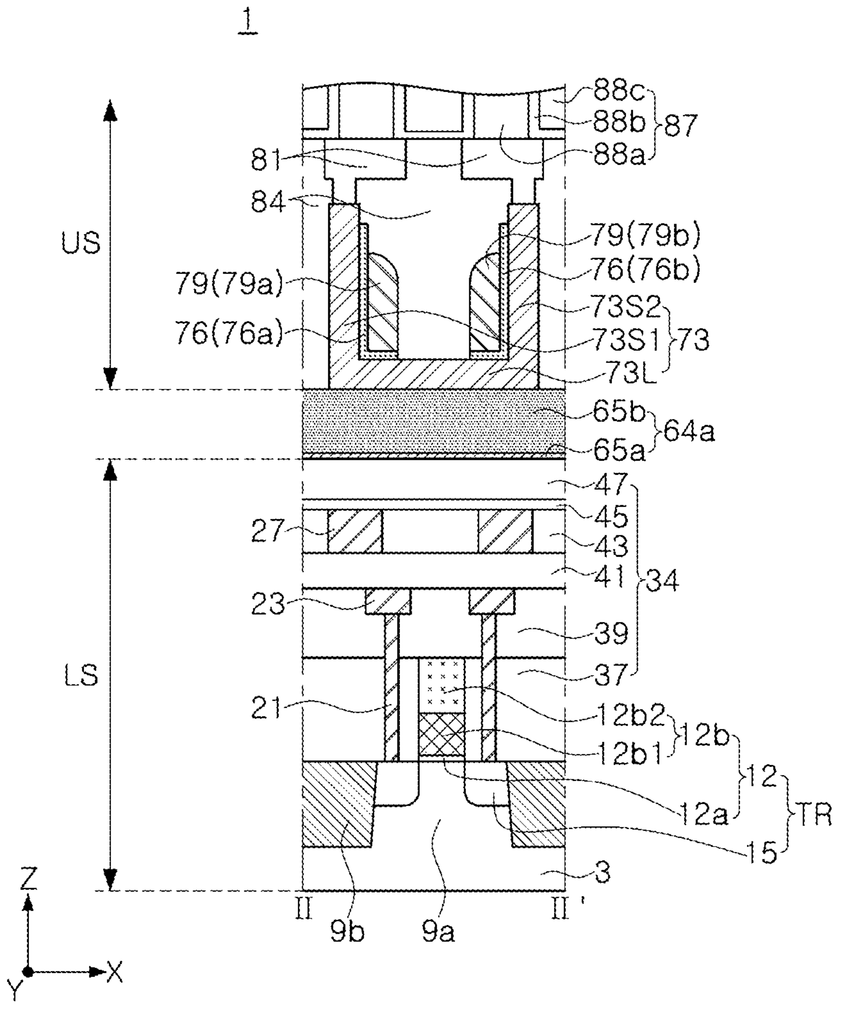

Herein, an example of a semiconductor device according to example embodiments of the present disclosure is described with reference to FIGS. 1, 2A, and 2B. FIGS. 1, 2A, and 2B are schematic views illustrating an example of a semiconductor device according to an example embodiment of the present disclosure. FIG. 1 is a schematic plan view illustrating an example of a semiconductor device according to an example embodiment of the present disclosure. FIG. 2A is a cross-sectional view illustrating a region taken along line I-I' of FIG. 1. FIG. 2B is a cross-sectional view illustrating a region taken along line II-IF of FIG. 1.

Referring to FIGS. 1, 2A, and 2B, a semiconductor device 1 according to an example embodiment may include a lower structure LS, an interlayer insulating layer 54 on the lower structure LS, first conductive lines 57*a* passing through the interlayer insulating layer 54, a capping insulating layer 61 on the interlayer insulating layer 54 and the first conductive lines 57*a*, and second conductive lines 64*a* passing through the capping insulating layer 61 and the interlayer insulating layer 54.

The lower structure LS may include a substrate 3, a circuit device TR on the substrate 3, a lower insulating structure 34 covering the circuit device TR on the substrate 3, and a wiring structure 18 electrically connected to the circuit device TR on the substrate 3 and buried in the lower insulating structure 34.

The substrate 3 may be a semiconductor substrate. For example, the substrate 3 may include a group IV semiconductor, a group III-V compound semiconductor, or a group II-VI compound semiconductor. For example, the group IV semiconductor may include silicon, germanium, or silicon-germanium. For example, the substrate 3 may include a silicon material, for example, a single crystal silicon material. The substrate 3 may be a silicon substrate, a silicon on insulator (SOI) substrate, a germanium substrate, a germanium on insulator (GOI) substrate, a silicon-germanium substrate, or a substrate including an epitaxial layer.

The circuit device TR may include a peripheral transistor. For example, the peripheral transistor may include a gate structure 12 disposed on a peripheral active region 9*a* defined by an isolation region 9*b* in the substrate 3, and peripheral source/drain regions 15 disposed in the peripheral active region 9*a* on opposite sides of the gate structure 12.

The gate structure 12 may include a peripheral gate electrode 12*b* and a peripheral gate dielectric layer 12*a* between the peripheral gate electrode 12*b* and the peripheral active region 9*a*. The peripheral gate electrode 12*b* may include at least two conductive layers, for example, a first conductive layer 12*b*1 and a second conductive layer 12*b*2 on the first conductive layer 12*b*1.

The lower insulating structure 34 may include a plurality of insulating layers 37, 39, 41, 43, 45, and 47. For example, the plurality of insulating layers 37, 39, 41, 43, 45, and 47 may include a first insulating layer 37, a second insulating layer 39, a third insulating layer 41, a fourth insulating layer 43, a fifth insulating layer 45, and a sixth insulating layer 47 being sequentially stacked. The first insulating layer 37 may be disposed on a side surface of the peripheral gate electrode 12*b*, and the second insulating layer 39 may cover the first insulating layer 37 and the peripheral gate electrode 12*b*.

The wiring structure 18 may include a first plug 21 electrically connected to the circuit device TR, a first connection pattern 23 on the first plug 21, a second plug 25 on the first connection pattern 23, a second connection pattern 27 on the second plug 25, and a first contact plug 29 on the second connection pattern 27. The first and second insulating layers 37 and 39 may surround side surfaces of the first plug 21 and the first connection pattern 23. The third insulating layer 41 may surround a side surface of the second plug 25. The fourth insulating layer 43 may surround a side surface of the second connection pattern 27. The fifth and sixth insulating layers 45 and 47 may surround a side surface of the first contact plug 29.

The first contact plug 29 may include a conductive pattern 29*b* and a barrier layer 29*a* covering a side surface and a bottom surface of the conductive pattern 29*b*.

The fifth insulating layer 45 may be an etch stop layer having a thickness less than that of the sixth insulating layer 47, the etch stop layer including a material different from that of the sixth insulating layer 47. For example, the sixth insulating layer 47 may include silicon oxide or a low-K dielectric, and the fifth insulating layer 45 may include an insulating material such as SiN, SiCN, or SiBN.

A thickness of the capping insulating layer 61 may be less than a thickness of the interlayer insulating layer 54.

The interlayer insulating layer 54 may include silicon oxide or a low-x dielectric.

In an example, the capping insulating layer 61 may include a material the same as that of the interlayer insulating layer 54.

In another example, the capping insulating layer 61 may include a material different from that of the interlayer insulating layer 54. For example, the capping insulating layer 61 may include an insulating material such as SiN, SiCN, or SiBN.

Each of the first conductive lines 57*a* may extend in a first horizontal direction X. Each of the second conductive lines 64*a* may extend in the first horizontal direction X. The first conductive lines 57*a* may be repeatedly arranged alternately with the second conductive lines 64*a* in a second horizontal direction Y. The first horizontal direction X and the second horizontal direction Y may be parallel to an upper surface of the substrate 3. The first horizontal direction X and the second horizontal direction Y may be perpendicular to each other.

In an example embodiment, the first conductive lines 57*a* may serve to screen capacitive coupling between the second conductive lines 64*a*. For example, the first conductive lines 57*a* may reduce or block parasitic capacitance between the second conductive lines 64*a*, thereby minimizing RC delay of the second conductive lines 64*a*. The first conductive lines 57*a* may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or combinations thereof. The first conductive lines 57*a* may include a single layer or multiple layers formed of the above-described materials.

In an example embodiment, the second conductive lines 64*a* may be bit lines of a memory device. Accordingly, the second conductive lines 64*a* may be referred to as bit lines, and the first conductive lines 57*a* may be shielding lines or shield patterns screening capacitive coupling between bit lines. The first conductive lines 57*a* may be referred to as conductive shielding lines or conductive shield patterns.

Hereinafter, "the first conductive lines 57*a*" will be referred to as "conductive shielding lines," and "the second conductive lines 64*a*" will be referred to as bit lines. In addition, hereinafter, one conductive shielding line 57*a* and one bit line 64*a* adjacent to each other will mainly be described.

An upper surface of the bit line 64*a* may be on a level higher than the level of an upper surface of the conductive shielding line 57*a*.

In an example, a lower surface of the bit line 64*a* may be on a level substantially the same as the level of a lower surface of the conductive shielding line 57*a*.

The bit line 64*a* may include doped polysilicon, a metal, a conductive metal nitride, a metal-semiconductor compound, a metal compound, a conductive metal oxide, graphene, carbon nanotubes, or combinations thereof. For example, the bit line 64*a* may include a conductive pattern 65*b* and a barrier layer 65*a* covering a side surface and a bottom surface of the conductive pattern 65*b*. For example, the barrier layer 65*a* may include at least one of TiN, TaN, WN, TiSiN, TaSiN, or RuTiN, and the conductive pattern 65*b* may include a metal material such as W or Mo.

As a non-limiting example, the first conductive line 57*a* may include at least one of the materials of the bit line 64*a*, but the example embodiments are not limited thereto. In some implementations, the first conductive line 57*a* may include a conductive material that is different from the materials of the bit line 64*a*.

The bit line 64*a* may be electrically connected to the first contact plug 29 while being in contact therewith. For example, the barrier layer 65*a* of the bit line 64*a* may be in contact with the first contact plug 29.

A width of the bit line 64*a* may be greater than the width of the first contact plug 29.

In an example, the width of the bit line 64*a* may be substantially equal to a width of the conductive shielding line 57*a*.

In another example, the width of the bit line 64*a* may be greater than the width of the conductive shielding line 57*a*.

Referring to FIG. 2B, the semiconductor device 1 may further include an upper structure US. The upper structure US may include a channel structure 73, word lines 79, data storage structures 87, and an upper insulating structure 84.

The channel structure 73 may be disposed on the bit line 64*a*. The channel structure 73 may include a horizontal portion 73L electrically connected to the bit line 64*a* while being in contact therewith, and a first vertical channel portion 73S1 and a second vertical channel portion 73S2 extending in a vertical direction Z from opposite sides of the horizontal portion 73L in the first horizontal direction X. The vertical direction Z may be a direction that is perpendicular to the upper surface of the substrate 3.

The channel structure 73 may be formed of a semiconductor material such as silicon or the like. The channel structure 73 may be formed of single crystal silicon or polysilicon. The channel structure 73 is not limited to a semiconductor material such as silicon or the like, and the channel structure 73 may be formed of another semiconductor material that is usable as a channel region of a transistor. For example, the channel structure 73 may include an oxide semiconductor layer or a two-dimensional (2D) material layer that is usable as a channel region of a transistor.

The oxide semiconductor layer may be indium gallium zinc oxide (IGZO). However, the example embodiment are not limited thereto. As non-limiting examples, the oxide semiconductor layer may include at least one of indium tungsten oxide (IWO), indium tin gallium oxide (ITGO), indium aluminum zinc oxide (IAGO), indium gallium oxide (IGO), indium tin zinc oxide (ITZO), zinc, zinc oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO).

The 2D material layer may include at least one of a transition metal dichalcogenide (TMD) material layer, a black phosphorous material layer, and a hexagonal boron-nitride (hBN) material layer, which may have semiconductor properties. For example, the 2D material layer may include at least one of BiOSe, Cr1, WSe2, MoS2, TaS, WS, SnSe, ReS, β-SnTe, MnO, AsS, P (black), InSe, h-BN, GaSe, GaN, SrTiO, MXene, and a Janus 2D material, which may form a 2D material.

Each of the word lines 79 may extend in the second horizontal direction Y. A pair of word lines 79*a* and 79*b* among the word lines 79 may vertically overlap the horizontal portion 73L of the channel structure 73, and may be disposed between the first and second vertical channel portions 73S1 and 73 S2 of the channel structure 73. The pair of word lines 79*a* and 79*b* may include a first word line 79*a* opposing the first vertical channel portion 73S1 and a second word line 79*b* opposing the second vertical channel portion 73S2.

The upper structure US may further include dielectric structures 76 between the word lines 79 and the channel structure 73. The dielectric structures 76 may include a first dielectric structure 76*a*, which may be disposed between the first word line 79*a* and the first vertical channel portion 73S1 and between the first word line 79*a* and the horizontal portion 73L, and a second dielectric structure 76*b*, which may be disposed between the second word line 79*b* and the second vertical channel portion 73S2 and between the second word line 79*b* and the horizontal portion 73L.

In an example, each of the dielectric structures 76 may be a tunnel dielectric layer not including a data storage layer. For example, each of the dielectric structures 76 may include at least one of silicon oxide and a high-K dielectric. The high-K dielectric may include a metal oxide or a metal oxynitride. For example, the high-K dielectric may be formed of $HfO_2$, HfSiO, HfSiON, HfTaO, HfTiO, HfZrO, $ZrO_2$, $Al_2O_3$, or combinations thereof, as non-limiting examples. Each of the dielectric structures 76 may be formed of a single layer or multiple layers formed of the above-described materials.

In another example, each of the dielectric structures 76 may include a data storage layer and a dielectric layer. For example, each of the dielectric structures 76 may include a ferroelectric layer, which may have polarization properties according to an electric field and may have remnant polarization due to a dipole even in the absence of an external electric field. Data may be recorded using a polarization state in the ferroelectric layer. Accordingly, each of the dielectric structures 76 may include a ferroelectric layer, which may be referred to as a data storage layer. The ferroelectric layer, which may be the data storage layer, may include an Hf-based compound, a Zr-based compound, and/or an Hf—Zr-based compound. For example, the Hf-based compound may be an HfO-based ferroelectric material, the Zr-based compound may include a ZrO-based ferroelectric material, and the Hf—Zr-based compound may include a hafnium zirconium oxide (HZO)-based ferroelectric material. The ferroelectric layer, which may be the data storage layer, may include a ferroelectric material doped with an impurity, for example, at least one of C, Si, Mg, Al, Y, N, Ge, Sn, Gd, La, Sc, and Sr. For example, the ferroelectric layer, which may be the data storage layer, may be a material obtained by doping at least one of $HfO_2$, $ZrO_2$, and HZrO with at least one of C, Si, Mg, Al, Y, N, Ge, Sn, Gd, La, Sc, and Sr.

In the dielectric structures 76, the data storage layer is not limited to the above-described types of materials, and the data storage layer may include a material capable of storing information.

The upper structure US may further include landing pads 81 electrically connected to each of the first and second vertical channel portions 73S1 and 73S2 while being in contact therewith, on the channel structure 73. The landing pads 81 may be formed of a conductive material.

The upper insulating structure 84 may be disposed on the bit lines 64*a* and the capping insulating layer 61. The upper insulating structure 84 may cover a side surface of a structure including the channel structure 73, the word lines 79, and the landing pads 81.

The data storage structure 87 may include first electrodes 88*a* electrically connected to the landing pads 81 while being in contact therewith, a second electrode 88*c* on the first electrodes 88*a*, and a dielectric layer 88*b* between the first electrodes 88*a* and the second electrode 88*c*.

In an example, the data storage structure 87 may be a capacitor in which a DRAM stores information. For example, the dielectric layer 88*b* of the data storage structure 87 may be a capacitor dielectric layer of the DRAM, and the dielectric layer 88*b* may be a high-K dielectric layer. As non-limiting examples, the material of the dielectric layer 88*b* may be silicon oxide, silicon nitride, silicon oxynitride, or combinations thereof.

In another example, the data storage structure 87 may be a structure for storing information, at a memory different from the DRAM. For example, the data storage structure 87 may be a capacitor of a ferroelectric memory (FeRAM). For example, the dielectric layer 88*b* may be a ferroelectric layer capable of recording data using a polarization state. In another example, the dielectric layer 88*b* may include a lower dielectric layer and a ferroelectric layer on the lower dielectric layer. Here, the lower dielectric layer may include at least one of silicon oxide, silicon oxynitride, silicon nitride, and a high-x dielectric.

In an example embodiment, when the dielectric structures 76 include a data storage layer, the data storage structure 87 may be omitted.

Hereinafter, various modifications of elements of the above-described example embodiment will be described. The various modifications of the elements of the above-described example embodiment described below will mainly be described with respect to elements to be modified or elements to be replaced. In addition, the elements that are modifiable or replaceable to be described below are described with reference to drawings below, but the elements that are modifiable or replaceable may be combined with each other, or may be combined with the elements described above to configure a semiconductor device according to example embodiments.

FIGS. 3, 4, 5, 6, 7, and 8 are schematic cross-sectional views illustrating a modification of a semiconductor device according to an example embodiment of the present disclosure. FIGS. 3, 4, 5, 6, 7, and 8 illustrate various modifications of a cross-sectional structure of a region taken along line I-I' of FIG. 1.

Figure 3:
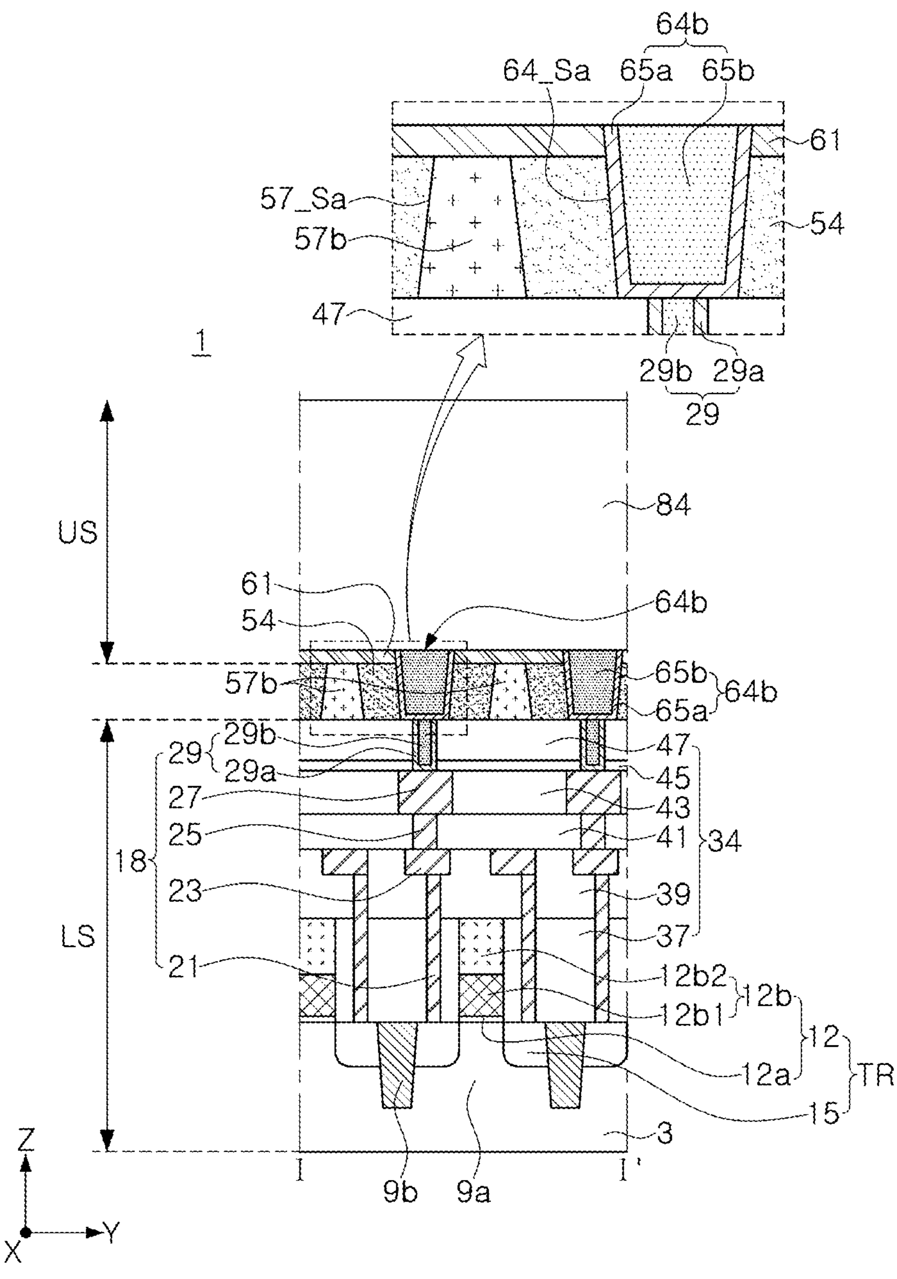
FIG. 3 is a schematic cross-sectional view illustrating a modification of a semiconductor device according to an example embodiment.

In a modification, referring to FIG. 3, the bit line (64*a* in FIG. 2A) having a substantially vertical side surface illustrated in FIG. 2A may be modified as a bit line 64*b* having a side surface 64_Sa having a negative slope, as illustrated in FIG. 3. The bit line 64*b* may have the side surface 64_Sa inclined such that a width thereof gradually decreases from an upper region thereof to a lower region thereof.

The conductive shielding line (57*a* in FIG. 2A) having a substantially vertical side surface illustrated in FIG. 2A may be modified as a conductive shielding line 57*b* having a side surface 57_Sa having a positive slope. The conductive shielding line 57*b* may have the side surface 57_Sa inclined such that a width thereof gradually increases from an upper region thereof to a lower region thereof.

A width of the bit line 64*b* may be greater than that of the conductive shielding line 57*b*. A maximum width of the bit line 64*b* may be greater than a maximum width of the conductive shielding line 57*b*. A minimum width of the bit line 64*b* may be equal to or greater than the maximum width of the conductive shielding line 57*b*.

Figure 4:
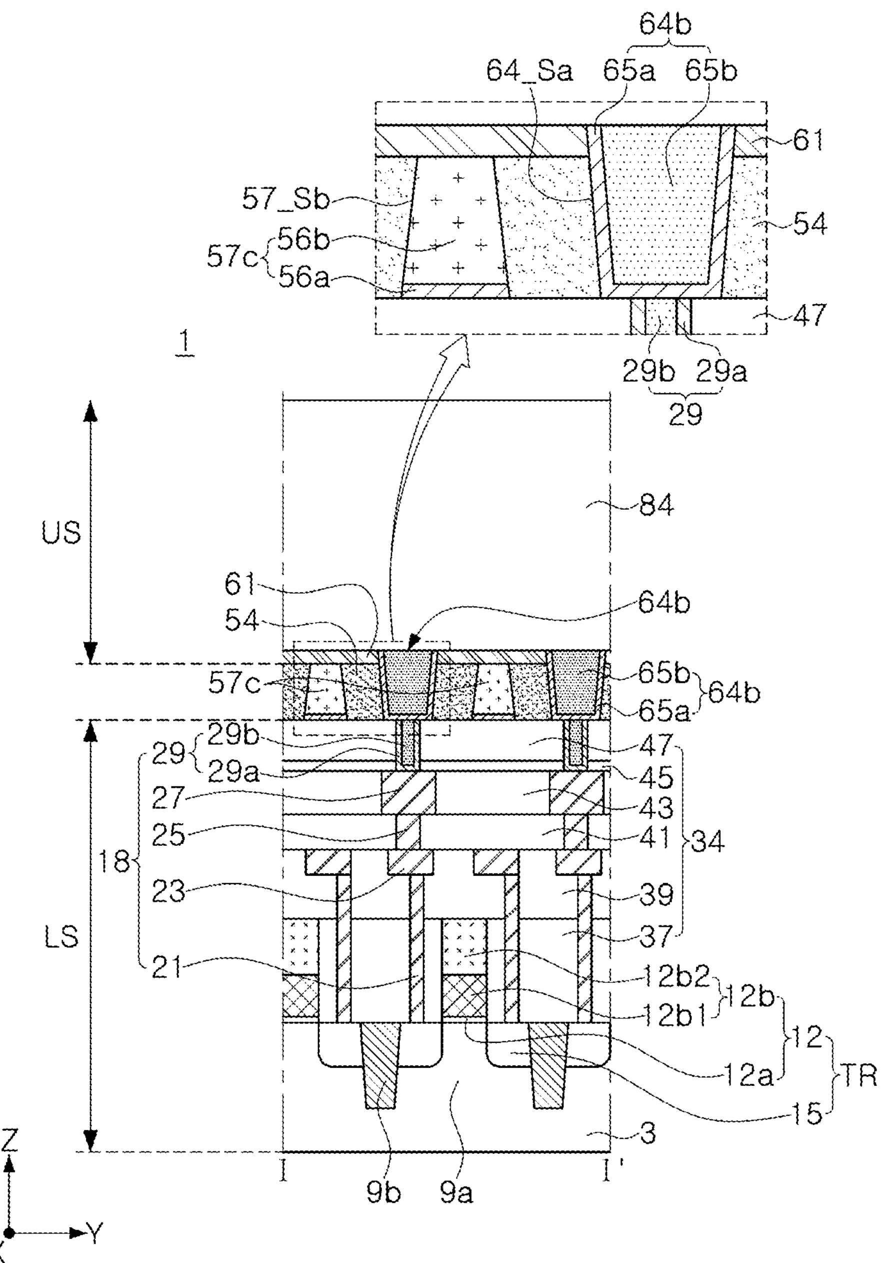
FIG. 4 is a schematic cross-sectional view illustrating a modification of a semiconductor device according to an example embodiment.

In some implementations, referring to FIG. 4, the conductive shielding line (57*a* in FIG. 2A) in FIG. 2A or the conductive shielding line (57*b* in FIG. 3) in FIG. 3 may be modified into a conductive shielding line 57*c* including a sequentially stacked shield barrier layer 56*a* and a shield conductive pattern 56*b* on the shield barrier layer 56*a*.

The shield barrier layer 56*a* may include at least one of TiN, TaN, WN, TiSiN, TaSiN, or RuTiN, and the shield conductive pattern 56*b* may include a metal material such as W or Mo.

The conductive shielding line 57*c* may have a side surface 57_Sb having a positive slope, as described with reference to FIG. 3. A side surface of the shield conductive pattern 56*b* may be in contact with the interlayer insulating layer 54. A thickness of the shield conductive pattern 56*b* may be greater than a thickness of the shield barrier layer 56*a*.

Figure 5:
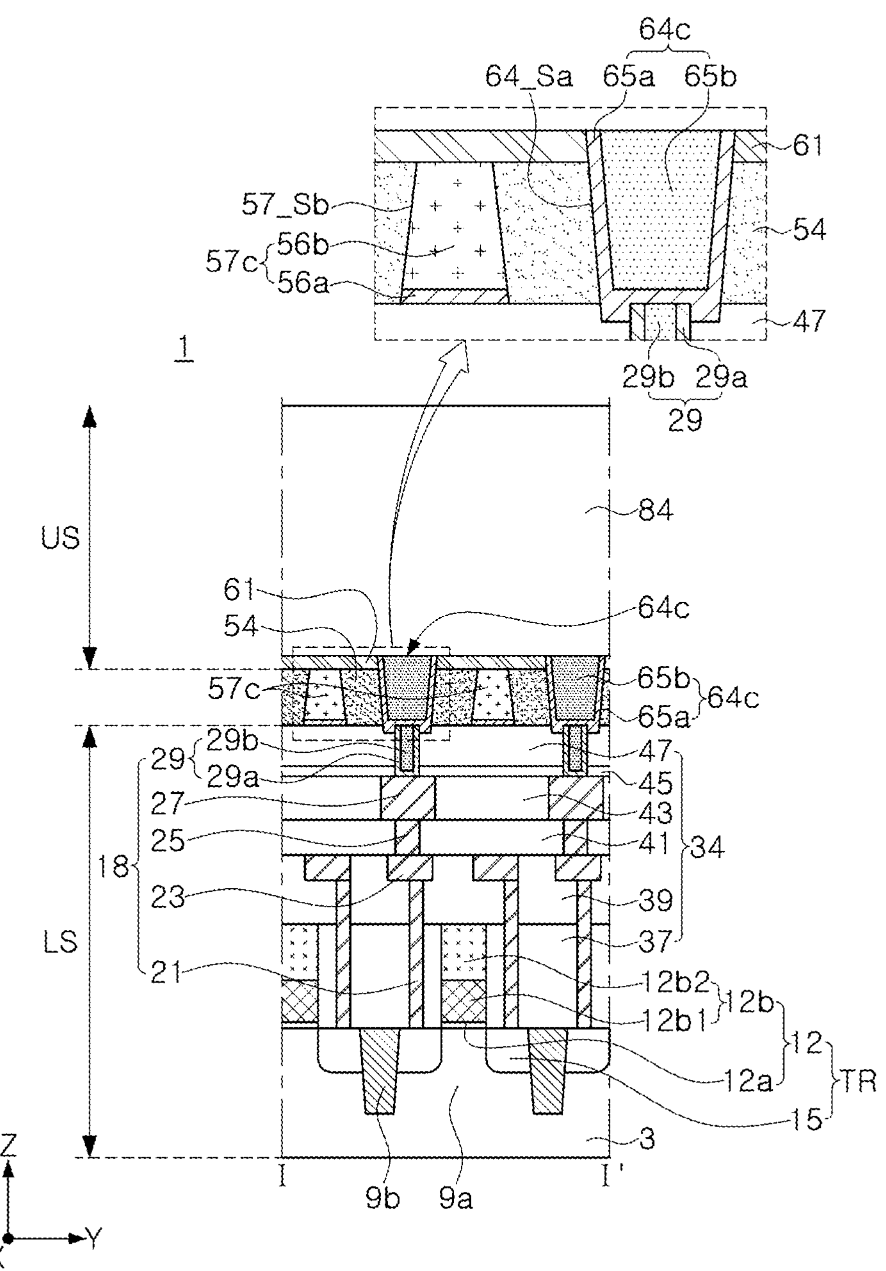
FIG. 5 is a schematic cross-sectional view illustrating a modification of a semiconductor device according to an example embodiment.

In a modification, referring to FIG. 5, the bit line (64*a* in FIGS. 2A and 64*b* in FIGS. 3 and 4) described above may be modified into a bit line 64*c* covering an upper surface and a side surface of an upper region of the first contact plug 29, as illustrated in FIG. 5. For example, the semiconductor device 1 may include the bit line 64*c*, together with the conductive shielding line 57*c* described with reference to FIG. 4.

As illustrated in FIG. 5, the bit line 64*c* may have a side surface 64_Sa having a negative slope, and a lowermost end of the bit line 64*c* may be disposed on a level lower than that of a lowermost end of the conductive shielding line 57*c*.

Figure 6:
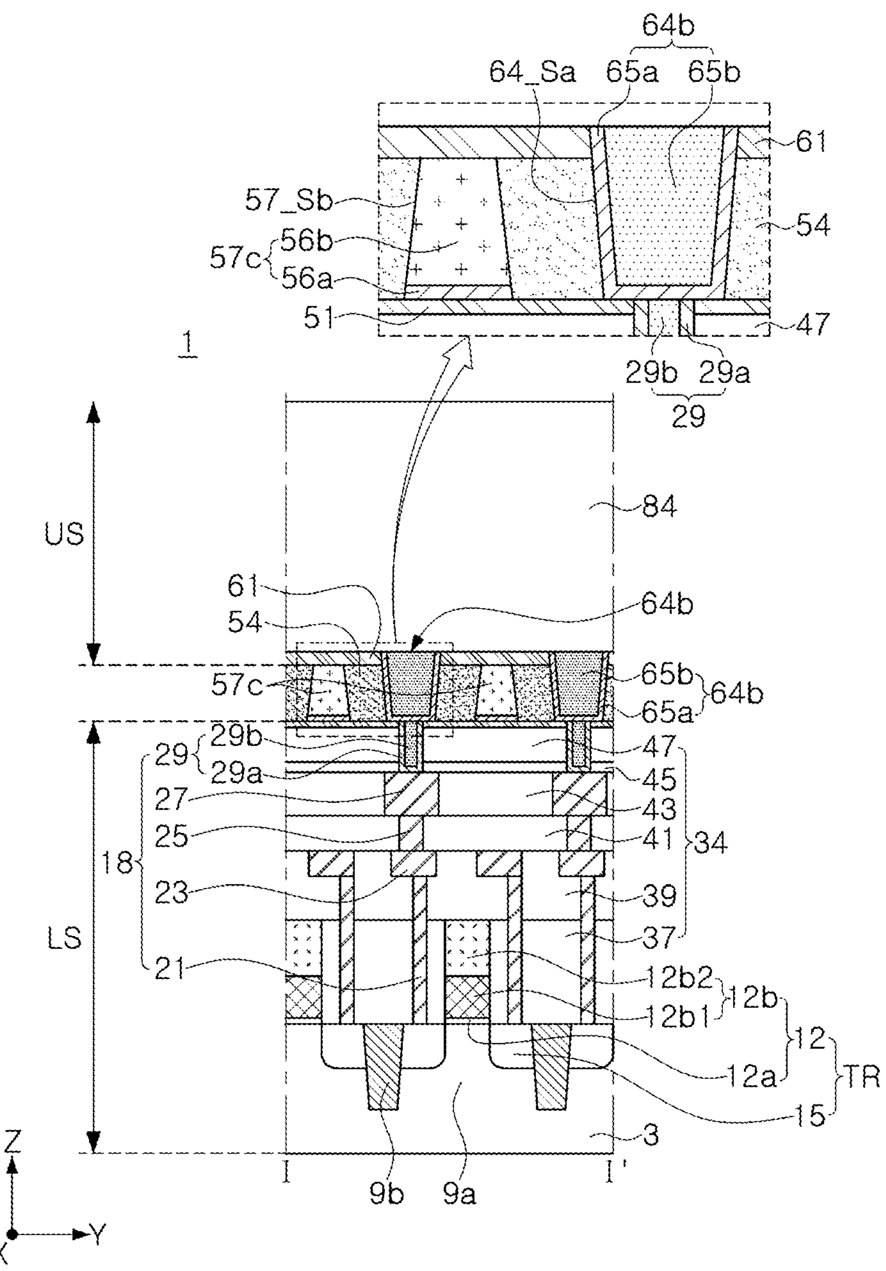
FIG. 6 is a schematic cross-sectional view illustrating a modification of a semiconductor device according to an example embodiment.

In a modification, referring to FIG. 6, the lower structure LS may further include an etch stop layer 51 on the interlayer insulating layer 47. The etch stop layer 51 may include a material different from that of the interlayer insulating layer 47. For example, the interlayer insulating layer 47 may include silicon oxide or a low-x dielectric, and the etch stop layer 51 may include an insulating material such as SiN, SiCN, or SiBN.

The first contact plug 29 may pass through the interlayer insulating layer 47 and the etch stop layer 51. The conductive shielding line (57*a* in FIG. 2A, 57*b* in FIG. 3, and 57*c* in FIG. 4) and the bit line (64*a* in FIGS. 2A and 64*b* in FIGS. 3 and 4) described above with reference to FIGS. 2A, 3, and 4 may be disposed on the etch stop layer 51. For example, the bit line 64*b* illustrated in FIG. 6 may be disposed on the etch stop layer 51 electrically connected to the first contact plug 29 while being in contact therewith. A lower surface of the conductive shielding line 57*c* illustrated in FIG. 6 may be in contact with an upper surface of the etch stop layer 51.

Figure 7:
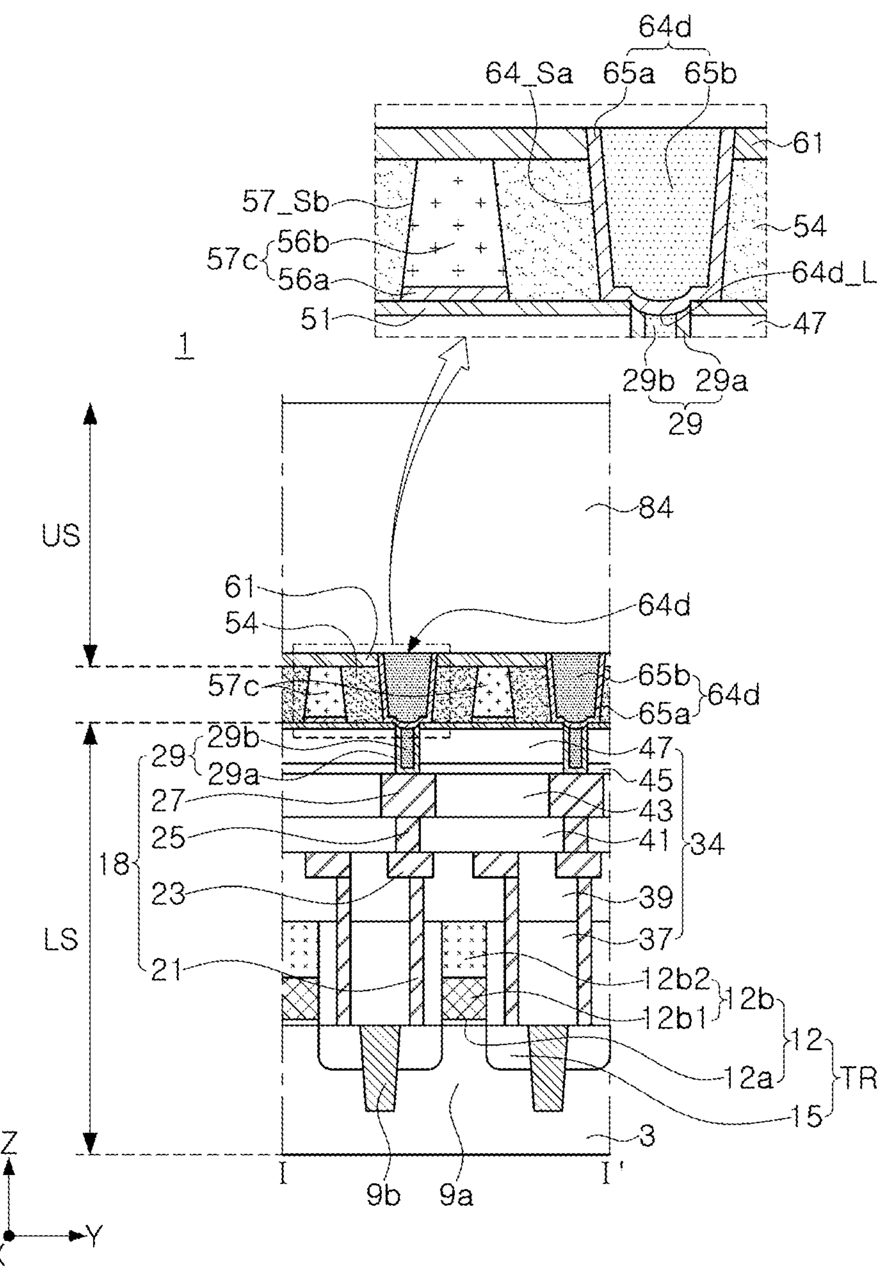
FIG. 7 is a schematic cross-sectional view illustrating a modification of a semiconductor device according to an example embodiment.

In an embodiment, referring to FIG. 7, a portion of the bit line (64*a* in FIGS. 2A, 64*b* in FIGS. 3 and 4, and 64*b* in FIG. 6) in contact with the first contact plug 29 may be modified into a bit line 64*d* in FIG. 7. For example, a lower surface 64*d*_L of the bit line 64*d* in contact with the first contact plug 29 may have a downwardly curved shape.

Figure 8:
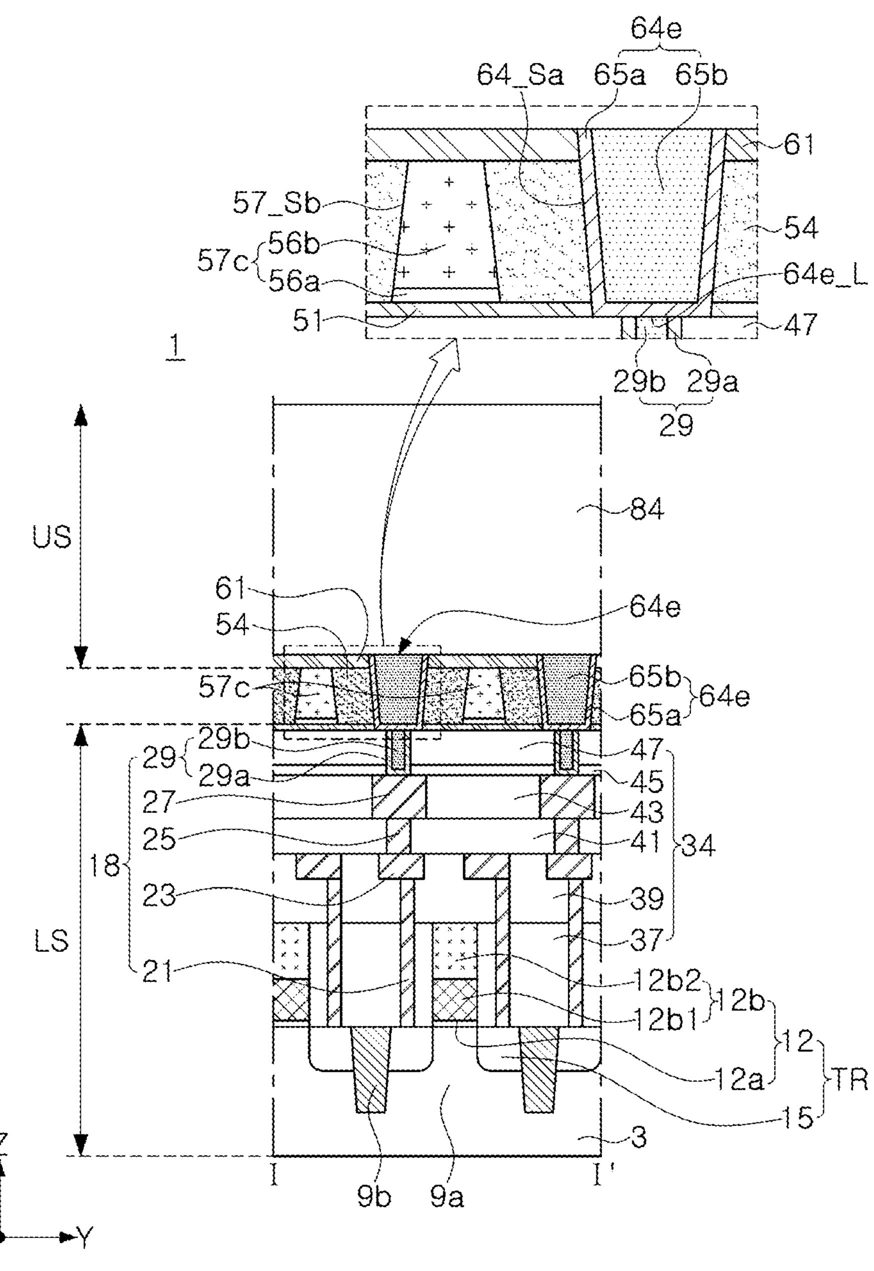
FIG. 8 is a schematic cross-sectional view illustrating a modification of a semiconductor device according to an example embodiment.

In a modification, referring to FIG. 8, the bit line (64*b* in FIG. 6) disposed on the etch stop layer 51 described above with reference to FIG. 6 may be modified into a bit line 64*e* passing through the etch stop layer 51. The bit line 64*e* may pass through the etch stop layer 51 and may be in contact with the interlayer insulating layer 47 and the first contact plug 29. A lower surface 64*e*_L of the bit line 64*e* may be disposed on a level lower than that of an upper surface of the etch stop layer 51. As described with reference to FIG. 6, the conductive shielding line 57*c* may be disposed on the etch stop layer 51. The lower surface 64*e*_L of the bit line 64*e* may be disposed on a level lower than that of the lower surface of the conductive shielding line 57*c*. An upper surface of the first contact plug 29 may be disposed on a level lower than that of the lower surface of the conductive shielding line 57*c*.

Figure 9A:
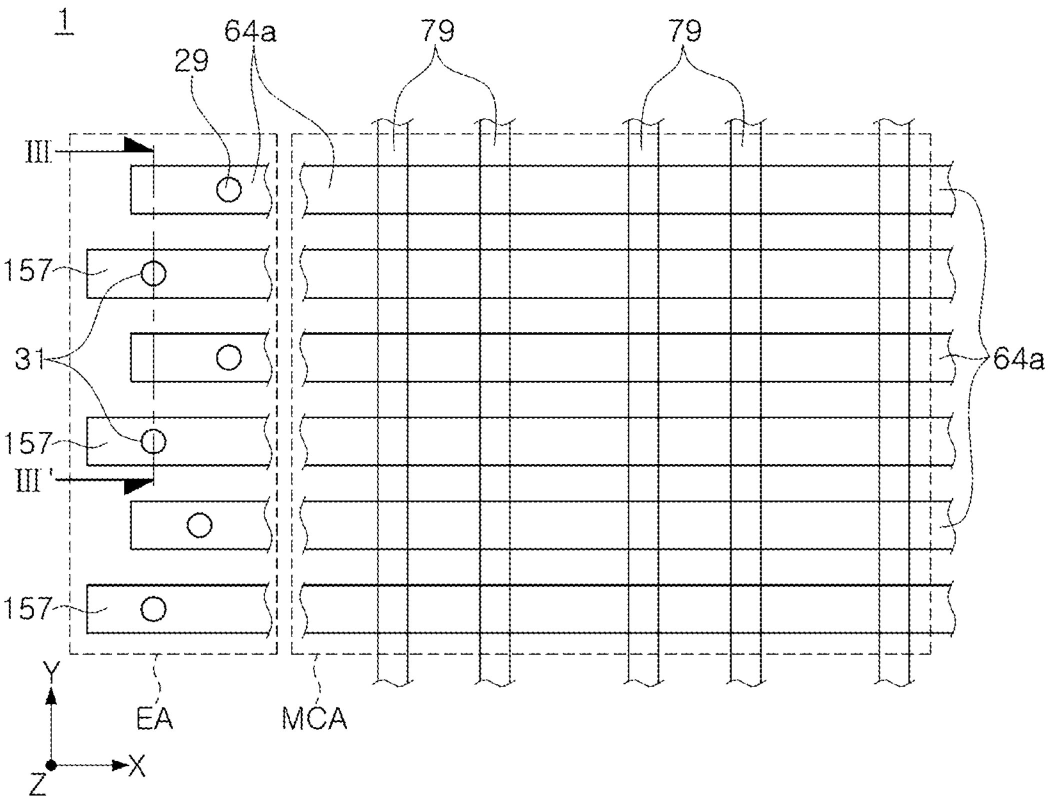
FIGS. 9A and 9B are schematic views illustrating modifications of a semiconductor device according to an example embodiment.

Subsequently, with reference to FIGS. 9A and 9B, modifications of the conductive shielding line (57*a* in FIGS. 1 and 2A) and the wiring structure 18 will be described. FIG. 9A is a schematic plan view illustrating a modification of the conductive shielding line (57*a* in FIG. 1) in FIG. 1, and FIG. 9B is a schematic cross-sectional view illustrating a region taken along line in FIG. 1.

Figure 9B:
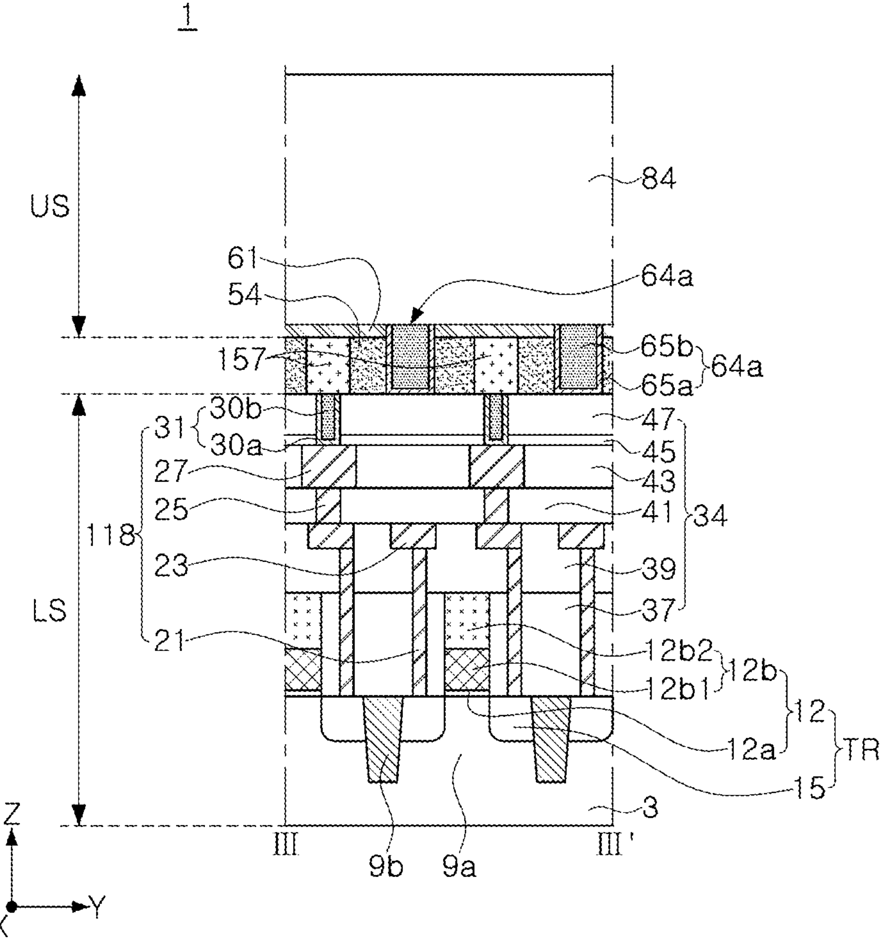

In a modification, referring to FIGS. 9A and 9B, the wiring structure (18 in FIG. 2A) described above may be modified into a wiring structure 118 further including a second contact plug 31, and the conductive shielding line (57*a* in FIGS. 1 and 2A) described above may be modified into a conductive shielding line 157 electrically connected to the second contact plug 31. The second contact plug 31 may include a conductive pattern 30*b* and a barrier layer 30*a* covering a side surface and a bottom surface of the conductive pattern 30*b*.

The wiring structure 118 may include the first contact plug 29 as described with reference to FIGS. 1, 2A, and 2B. The first contact plug 29 of the wiring structure 118 may be electrically connected to one bit line among the bit lines (64*a* in FIGS. 1 to 2B, 64*b* in FIGS. 3A, 4, and 6, 64*c* in FIG. 5, 64*d* in FIG. 7, and 64*e* in FIG. 8), for example, the bit line 64*a* described with reference to FIGS. 1, 2A, and 2B.

The second contact plug 31 and the conductive shielding line 157 described with reference to FIGS. 9A and 9B may be described in various combinations with all the example embodiments described above. For example, the wiring structure 18 of the example embodiments described with reference to FIGS. 3 to 8 may be modified into the wiring structure 118 including the second contact plug 3 illustrated in FIGS. 9A and 9B. The conductive shielding line (57*b* in FIGS. 3 and 57*c* in FIGS. 4 to 8) of the example embodiments described with reference to FIGS. 3 to 8 may be modified into the conductive shielding line 157 electrically connected to the second contact plug 31 illustrated in FIGS. 9A and 9B.

Figure 10:
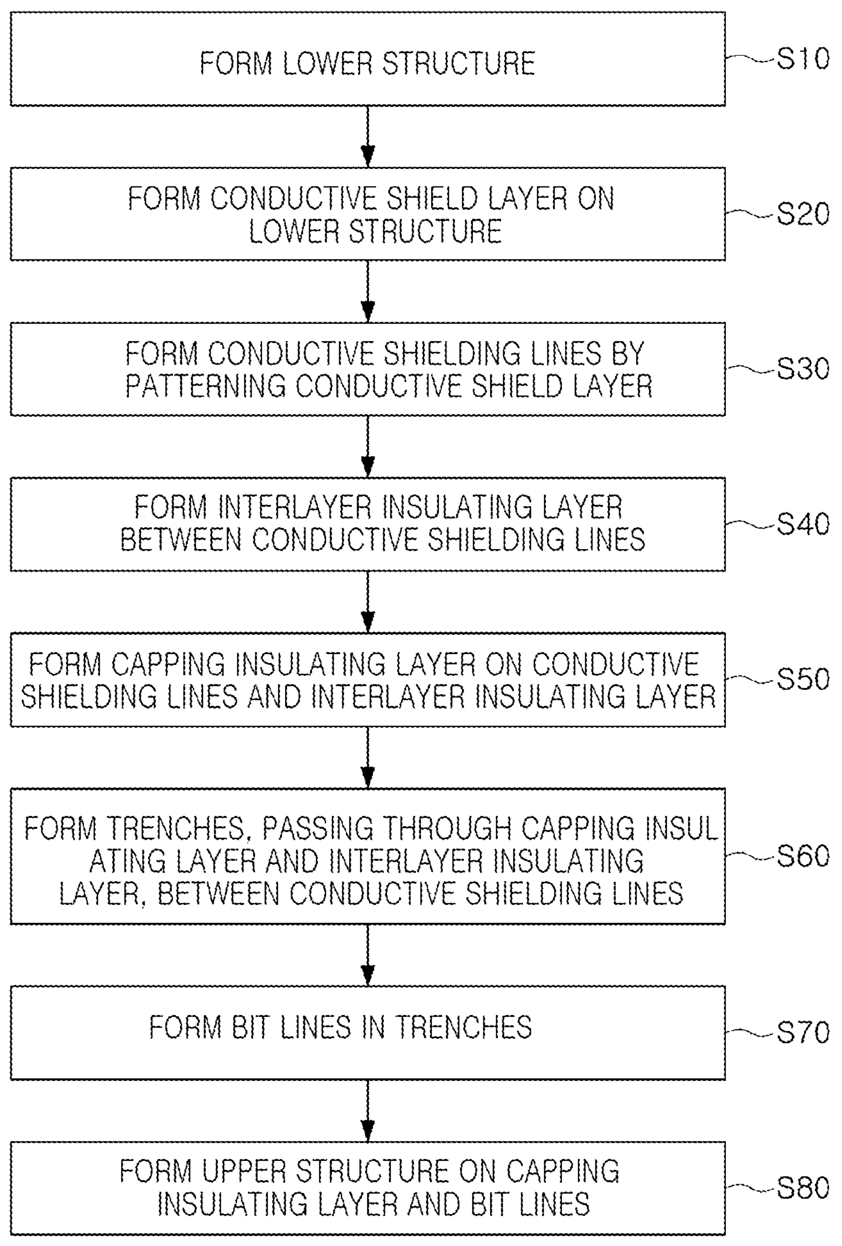
FIG. 10 is a schematic process flowchart illustrating an example of a method of manufacturing a semiconductor device according to example embodiments.

Subsequently, an example of a method of forming a semiconductor device according to an example embodiment of the present disclosure will be described with reference to FIGS. 1, 10, and 11A to 11D. FIG. 10 is a schematic process flowchart illustrating an example of a method of forming a semiconductor device according to an example embodiment of the present disclosure, and FIGS. 11A to 11D are schematic cross-sectional views illustrating a region taken along line I-I' of FIG. 1 so as to describe an example of a method of forming a semiconductor device according to an example embodiment of the present disclosure.

Figure 11A:
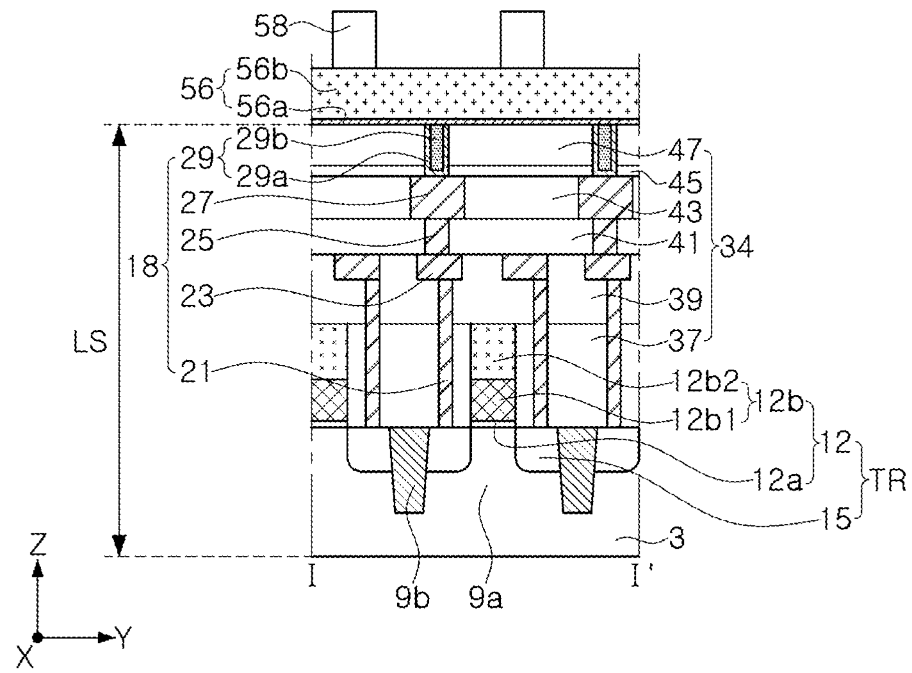
FIGS. 11A to 11D are schematic cross-sectional views illustrating an example of a method of manufacturing a semiconductor device according to an example embodiment.

Referring to FIGS. 1, 10 and 11A, a lower structure LS may be formed (S10). The lower structure LS may include the substrate 3, the circuit device TR on the substrate 3, the lower insulating structure 34 covering the circuit device TR on the substrate 3, and the wiring structure 18, electrically connected to the circuit device TR and buried in the lower insulating structure 34, on the substrate 3, as described with reference to FIGS. 2A and 2B.

The wiring structure 18 may include the first contact plug 29, as described with reference to FIG. 2A.

The wiring structure 18 may be modified into the wiring structure (118 in FIGS. 9A and 9B) further including the second contact plug 31, as described with reference to FIGS. 9A and 9B.

A conductive shield layer 56 may be formed on the lower structure LS (S20).

In an example, the conductive shield layer 56 may be formed of a single material layer.

In another example, the conductive shield layer 56 may be formed of a plurality of material layers sequentially stacked. For example, the conductive shield layer 56 may include a first material layer 56*a* and a second material layer 56*b* on the first material layer 56*a*. The first material layer 56*a* may be a barrier layer.

In another example, before the conductive shield layer 56 is formed, an etch stop layer (51 in FIGS. 6 to 8) may be formed, as illustrated in FIGS. 6 to 8. Here, the conductive shield layer 56 may be formed on the etch stop layer (51 in FIGS. 6 to 8). The etch stop layer (51 in FIGS. 6 to 8) may include an insulating material such as SiN, SiCN or SiBN.

A mask pattern 58 may be formed on the conductive shield layer 56. The mask pattern 58 may be a photoresist pattern.

Figure 11B:
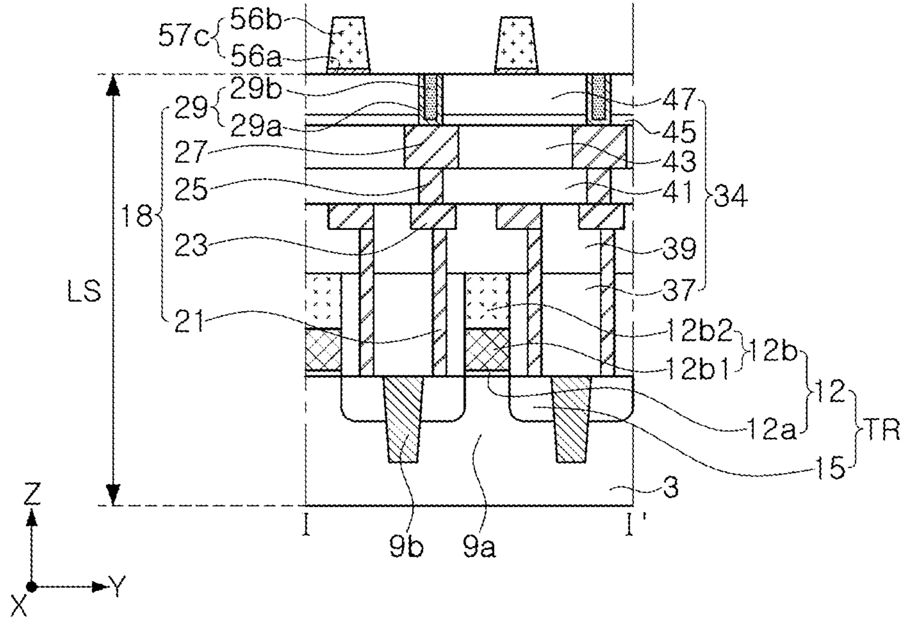

Referring to FIGS. 1, 10, and 11B, the conductive shield layer 56 may be patterned to form conductive shielding lines 57*c* (S30). Forming the conductive shielding lines 57*c* may include etching the conductive shield layer (56 in FIG. 11A) by an etching process using the mask pattern (58 in FIG. 11A) as an etch mask, and removing the mask pattern (58 in FIG. 11A).

In an implementation, the conductive shielding lines 57*c* may be the conductive shielding lines (57*c* in FIG. 4) described with reference to FIG. 4, but example embodiments are not limited thereto. For example, the conductive shielding lines 57*c* may be formed as conductive shielding lines (57*a* in FIG. 2A) illustrated in FIG. 2A or conductive shielding lines (57*b* in FIG. 3).

In another example, when an etch stop layer (51 in FIGS. 6 to 8) is formed as illustrated in FIGS. 6 to 8 before the conductive shield layer (56 in FIG. 11A) is formed, the conductive shielding lines 57*c* may be formed as the conductive shielding lines (57*c* in FIGS. 6 to 8), as illustrated in FIGS. 6 to 8.

Figure 11C:
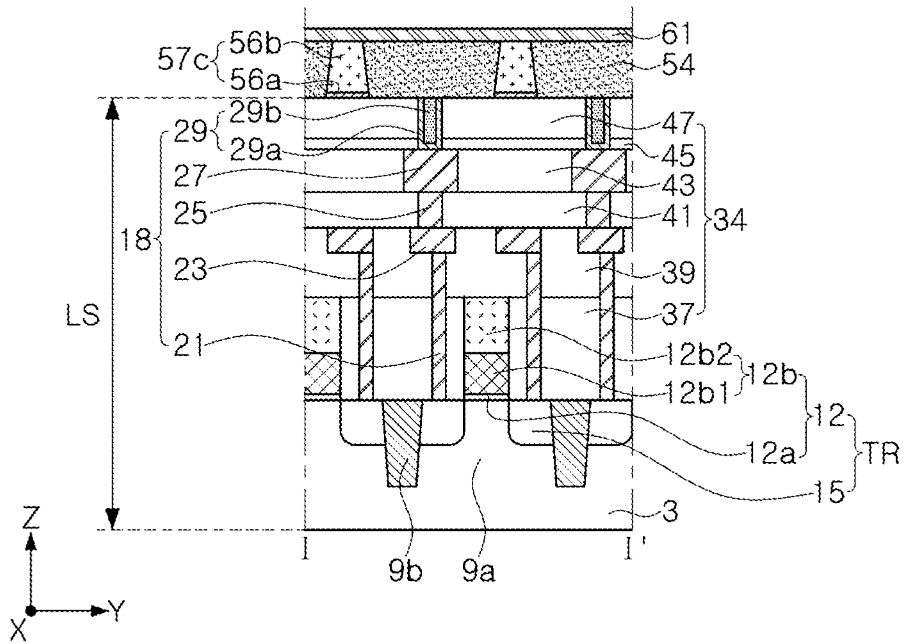

Referring to FIGS. 1, 10, and 11C, an interlayer insulating layer 54 may be formed between the conductive shielding lines 57*c* (S40). Forming the interlayer insulating layer 54 may include an forming an insulating layer filling in between the conductive shielding lines 57*c* and covering the conductive shielding lines 57*c*, and planarizing the insulating layer until upper surfaces of the conductive shielding lines 57*c* are exposed.

A capping insulating layer 61 may be formed on the conductive shielding lines 57*c* and the interlayer insulating layer 54 (S50). A thickness of the capping insulating layer 61 may be less than a thickness of the interlayer insulating layer 54.

In some implementations, the interlayer insulating layer 54 and the capping insulating layer 61 may be formed of the same material, for example, silicon oxide or a low-x dielectric.

In some implementations, the interlayer insulating layer 54 and the capping insulating layer 61 may be formed of different materials. For example, the interlayer insulating layer 54 may be formed of silicon oxide, a low-x dielectric, or a silicon oxide-based material, and the capping insulating layer 61 may be formed of an oxide-based material different from that of the interlayer insulating layer 54 or a silicon nitride-based material.

The capping insulating layer 61 may be a planarization stop layer. For example, the capping insulating layer 61 may be a planarization stop layer in a chemical mechanical polishing process.

Figure 11D:
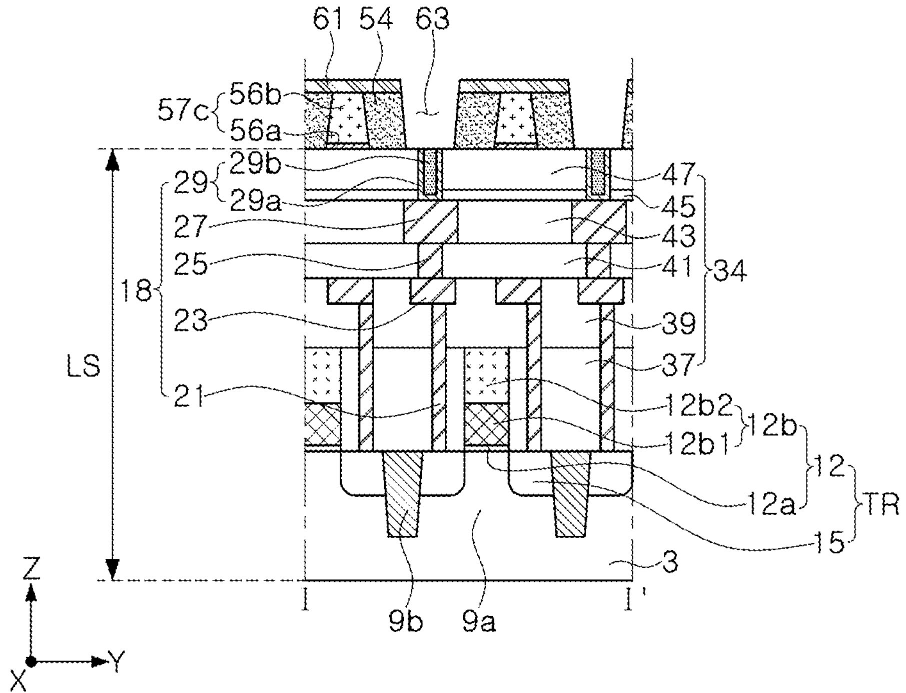

Referring to FIGS. 1, 10 and 11D, trenches 63, passing through the capping insulating layer 61 and the interlayer insulating layer 54, may be formed between the conductive shielding lines (S60). The trenches 63 may expose the first contact plugs 29.

In another example, the trenches 63 may pass through the interlayer insulating layer 54 and extend into the sixth insulating layer 47 to expose upper regions of the first contact plugs 29.

In another example, when an etch stop layer (51 in FIG. 6) is formed as illustrated in FIG. 6 before the conductive shield layer (56 in FIG. 11A) is formed, the trenches 63 may expose the etch stop layer (51 in FIG. 6). Here, the first contact plugs 29 may include a portion passing through the etch stop layer (51 in FIG. 6), and may be exposed by the trenches 63.

In another example, when an etch stop layer (51 in FIG. 7) is formed as illustrated in FIG. 7 before the conductive shield layer (56 in FIG. 11A) is formed, the trenches 63 may expose the etch stop layer. (51 in FIG. 7). Here, the first contact plugs 29 may include a portion passing through the etch stop layer (51 in FIG. 7), and the trenches 63 may expose the etch stop layer (51 in FIG. 7), and may expose upper surfaces of the first contact plugs 29 while recessing the upper surfaces of the first contact plugs 29.

In another example, when an etch stop layer (51 in FIG. 8) is formed as illustrated in FIG. 8 before the conductive shield layer (56 in FIG. 11A) is formed, the trenches 63 may pass through the etch stop layer (51 in FIG. 8). Here, the first contact plugs 29 may be formed below the etch stop layer (51 in FIG. 8), and the trenches 63 may expose the first contact plugs 29 while passing through the etch stop layer (51 in FIG. 8).

Referring to FIGS. 1, 10, and 4, bit lines (64*b* in FIG. 4) may be formed in the trenches (63 in FIG. 11D) (S70).

Forming the bit lines 64*b* may include forming a first material layer 65*a* conformally covering inner walls of the trenches (63 in FIG. 11D) and an upper surface of the capping insulating layer 61, forming a second material layer 65*b* filling the trenches (63 in FIG. 11D) on the first material layer 65*a*, and planarizing the first and second material layers 65*a* and 65*b* until the upper surface of the capping insulating layer 61 is exposed. The planarization may be a chemical mechanical polishing process, and the capping insulating layer 61 may be a planarization stop layer. The first material layer 65*a* may be a barrier layer.

The bit lines 64*b* may be the bit lines (64*b* in FIG. 4) described with reference to FIG. 4, as non-limiting examples. For example, depending on various forms of the trenches 63 described with reference to FIG. 11D, the bit lines 64*b* may be the bit lines (64*a* in FIGS. 1, 2A, and 2B) described with reference to FIGS. 1, 2A, and 2B, the bit lines (64*b* in FIG. 3) described with reference to FIG. 3, the bit lines (64*c* in FIG. 5) described with reference to FIG. 5, the bit lines (64*b* in FIG. 6) described with reference to FIG. 6, the bit lines (64*d* in FIG. 7) described with reference to FIG. 7, or the bit lines (64*e* in FIG. 8) described with reference to FIG. 8.

Referring to FIGS. 1, 10, 2A, and 2B, an upper structure US may be formed on the capping insulating layer 61 and the bit lines 64*a* (S80). As illustrated in FIG. 2B, the upper structure US may include the channel structure 73, the dielectric structure 76, the word lines 79, the landing pads 81, the upper insulating structure 84, and the data storage structure 87. However, a form of the upper structure US is not limited to the example embodiment illustrated in FIG. 2B, and may be modified in various manners.

According to example embodiments, as illustrated in FIGS. 11A and 11B, the conductive shielding lines (57*c* in FIG. 11B) may be formed by a patterning process using a deposition and etching process, and the bit lines 64*b* may be formed by a damascene process in which a conductive material is filled in the trenches (63 in FIG. 11D), as described with reference to FIG. 11D. Accordingly, the conductive shielding lines (57*a*, 57*b*, 57*c*, and 157 in FIGS. 1 to 9B) may be formed to have a predetermined height, thereby improving a variation in height of the conductive shielding lines (57*a*, 57*b*, 57*c*, and 157 in FIGS. 1 to 9B). The bit lines (64*a*, 64*b*, 64*c*, 64*d*, and 64*e* in FIGS. 1 to 9B) may be formed by a damascene process, thereby improving interface properties between channel structures (73 in FIG. 2B) in contact with the bit lines (64*a*, 64*b*, 64*c*, 64*d*, and 64*e* in FIGS. 1 to 9B) and the bit lines (64*a*, 64*b*, 64*c*, 64*d*, and 64*e* in FIGS. 1 to 9B). Accordingly, the semiconductor device 1 according to example embodiments may include patterned conductive shielding lines (57*a*, 57*b*, 57*c*, and 157 in FIGS. 1 to 9B) and bit lines (64*a*, 64*b*, 64*c*, 64*d*, and 64*e* in FIGS. 1 to 9B) having a damascene structure, thereby improving electrical performance and reliability.

According to example embodiments of the present disclosure, a semiconductor device including conductive shielding lines and bit lines being alternately arranged may be provided. The conductive shielding lines may serve to screen capacitive coupling between the bit lines. Accordingly, the conductive shielding lines may reduce or block parasitic capacitance between the bit lines, thereby minimizing RC delay of the bit lines.

The conductive shielding lines may be formed in a patterning process using a deposition and etching process. In some implementations, the bit lines may be formed in a damascene process in which a conductive material is filled in the trenches. Accordingly, the conductive shielding lines may be formed to have a predetermined height, thereby avoiding a variation in height of the conductive shielding lines. The bit lines may be formed in a damascene process, thereby improving interface properties between channel structures in contact with the bit lines and the bit lines. Accordingly, a semiconductor device according to example embodiments may include patterned conductive shielding lines and bit lines having a damascene structure, and thus may have improved electrical performance and reliability.

The various and beneficial advantages and effects of the present disclosure are not limited to the above description, and will be more easily understood in the course of describing specific example embodiments of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:

a lower structure;

an interlayer insulating layer on the lower structure;

a conductive shielding line on the lower structure, the conductive shielding line penetrating through the interlayer insulating layer;

a capping insulating layer on the interlayer insulating layer and the conductive shielding line;

a bit line on the lower structure and penetrating through the capping insulating layer and the interlayer insulating layer, a vertical channel portion on the bit line;

a word line facing a side surface of the vertical channel portion; and a dielectric structure between the side surface of the vertical channel portion and the word line;

wherein an upper surface of the bit line is at a higher level than an upper surface of the conductive shielding line, and wherein a lower surface of the bit line is at a level equal to or lower than a level of a lower surface of the conductive shielding line.

2. The semiconductor device as claimed in claim 1, wherein the bit line includes a conductive pattern and a barrier layer covering a side surface and a lower surface of the conductive pattern.

3. The semiconductor device as claimed in claim 1, wherein a slope of a side surface of the bit line is different from a slope of a side surface of the conductive shielding line.

4. The semiconductor device as claimed in claim 3, wherein the side surface of the bit line has a negative slope.

5. The semiconductor device as claimed in claim 3, wherein the side surface of the conductive shielding line has a positive slope.

6. The semiconductor device as claimed in claim 1, wherein:

the conductive shielding line includes a shield barrier layer and a shield conductive pattern on the shield barrier layer, a thickness of the shield conductive pattern is greater than a thickness of the shield barrier layer, and a side surface of the shield conductive pattern is in contact with the interlayer insulating layer.

7. The semiconductor device as claimed in claim 1, wherein:

the lower structure includes a first contact plug, the bit line is in contact with the first contact plug, and a width of the bit line is greater than a width of the first contact plug.

8. The semiconductor device as claimed in claim 7, wherein the bit line is in contact with an upper surface of the first contact plug and a side surface of an upper region of the first contact plug.

9. The semiconductor device as claimed in claim 7, wherein a lower surface of the bit line contacting the first contact plug has a downwardly curved shape.

10. The semiconductor device as claimed in claim 1, wherein a lowermost end of the bit line is at a lower level than a lowermost end of the conductive shielding line.

11. The semiconductor device as claimed in claim 1, further comprising:

a landing pad on the vertical channel portion; and a data storage structure on the landing pad.

12. The semiconductor device as claimed in claim 1, wherein the lower structure includes:

a substrate;

a peripheral circuit on the substrate; and a wiring structure electrically connected to the peripheral circuit on the substrate, wherein the wiring structure includes a first contact plug electrically connected to the bit line and a second contact plug electrically connected to the conductive shielding line.

13. The semiconductor device as claimed in claim 1, wherein the capping insulating layer includes a material different from a material of the interlayer insulating layer.

14. A semiconductor device comprising:

a lower structure;

a first conductive line on the lower structure; and a second conductive line on the lower structure, the second conductive line being spaced apart from the first conductive line, wherein an upper surface of the second conductive line is at a higher level than an upper surface of the first conductive line, wherein a lower surface of the second conductive line is at a level the same as or lower than a level of a lower surface of the first conductive line, wherein a slope of a side surface of the second conductive line is different from a slope of a side surface of the first conductive line, wherein the side surface of the second conductive line has a negative slope, and wherein the side surface of the first conductive line is substantially vertical or has a positive slope.

15. The semiconductor device as claimed in claim 14, wherein the second conductive line includes a conductive pattern and a barrier layer covering a side surface and a bottom surface of the conductive pattern.

16. A semiconductor device comprising:

a substrate;

a circuit device on the substrate;

a wiring structure on the substrate and electrically connected to the circuit device;

bit lines respectively extending in a first horizontal direction, and at a level higher than a level of the wiring structure;

conductive shielding lines arranged alternately with the bit lines in a second horizontal direction perpendicular to the first horizontal direction; and word lines respectively extending in the second horizontal direction, wherein the word lines are at a higher level than the bit lines and the conductive shielding lines, wherein upper surfaces of the bit lines are at a higher level than upper surfaces of the conductive shielding lines, and wherein each of the bit lines has a negative slope.

17. The semiconductor device as claimed in claim 16, wherein a lowermost end of each of the bit lines is at a lower level than a lowermost end of each of the conductive shielding lines.

18. The semiconductor device as claimed in claim 16, wherein a width of each of the bit lines is greater than a width of each of the conductive shielding lines.

* * * * *